US010767838B2

(12) United States Patent
Kostelnik

(10) Patent No.: US 10,767,838 B2
(45) Date of Patent: Sep. 8, 2020

(54) LIGHTING UNIT

(71) Applicant: Würth Elektronik GmbH & Co. KG, Niedernhall (DE)

(72) Inventor: Jan Kostelnik, Kirchberg (DE)

(73) Assignee: Würth Elektronik GmbH & Co. KG, Niedernhall (DE)

( * ) Notice: Subject to any disclaimer, the term of this patent is extended or adjusted under 35 U.S.C. 154(b) by 103 days.

(21) Appl. No.: 14/028,339

(22) Filed: Sep. 16, 2013

(65) Prior Publication Data

US 2014/0098547 A1    Apr. 10, 2014

(30) Foreign Application Priority Data

Sep. 18, 2012 (DE) .................. 10 2012 216 665

(51) Int. Cl.
*F21V 14/00* (2018.01)
*H03K 17/955* (2006.01)
*F21K 9/61* (2016.01)
*B60Q 3/14* (2017.01)
*B60Q 3/78* (2017.01)
(Continued)

(52) U.S. Cl.
CPC .............. *F21V 14/003* (2013.01); *B60Q 3/14* (2017.02); *B60Q 3/20* (2017.02); *B60Q 3/54* (2017.02); *B60Q 3/78* (2017.02); *F21K 9/61* (2016.08); *F21V 23/0442* (2013.01); *F21V 23/0471* (2013.01); *H03K 17/955* (2013.01); *B60Q 2500/10* (2013.01); *F21W 2106/00* (2018.01); *F21Y 2115/10* (2016.08); *H03K 2217/960785* (2013.01)

(58) Field of Classification Search
CPC .............. B60Q 2500/10; B60Q 3/0209; B60Q 3/0289; B60Q 3/044; B60Q 3/20; B60Q 3/54; B60Q 3/78; B60Q 3/14; F21V 14/003; F21V 23/0442; F21V 23/005; F21V 23/0471; F21V 31/005; F21V 31/04; F21Y 2103/006; F21Y 2105/006; F21W 2101/08; H03K 17/9631; F21K 9/90
USPC .......... 362/488–492, 311.02, 311.13, 311.14, 362/311.15, 249.05, 249.12, 249.16, 276, 362/147

See application file for complete search history.

(56) References Cited

U.S. PATENT DOCUMENTS 5,444,932 A * 8/1995 Jeroma .................. G09F 13/08
40/564
6,092,915 A * 7/2000 Rensch .................. B32B 27/08
362/23.19
(Continued)

FOREIGN PATENT DOCUMENTS

DE    19802269 A1    10/1998
DE    19859195 A1     6/2000
(Continued)

OTHER PUBLICATIONS

Erfurt, Feb. 21, 2008, DE202007015925, English translation.*
(Continued)

*Primary Examiner* — Bryon T Gyllstrom
*Assistant Examiner* — James M Endo
(74) *Attorney, Agent, or Firm* — RM Reed Law PLLC

(57) ABSTRACT

A lighting unit includes a board, which supports a lamp and an electronic circuit for activating the lamp. The lamp includes one or more LEDs. The lighting unit further includes a decorative layer, which is applied directly to a surface of the board.

19 Claims, 2 Drawing Sheets

(51) Int. Cl.
*B60Q 3/20* (2017.01)
*B60Q 3/54* (2017.01)
*F21Y 115/10* (2016.01)
*F21W 106/00* (2018.01)
*F21V 23/04* (2006.01)

(56) References Cited

U.S. PATENT DOCUMENTS

| | | | | |
|---|---|---|---|---|
| 6,817,123 | B2* | 11/2004 | Okazaki | G09F 13/28 |
| | | | | 340/815.45 |
| 7,717,585 | B2* | 5/2010 | Bole | F21V 19/0005 |
| | | | | 362/249.02 |
| 8,215,788 | B2* | 7/2012 | Van Herpen | D05C 17/02 |
| | | | | 362/153 |
| 8,444,294 | B1* | 5/2013 | Hawkins | A47G 27/0212 |
| | | | | 362/100 |
| 2002/0031620 | A1* | 3/2002 | Yuzawa | B27D 1/00 |
| | | | | 428/1.1 |
| 2004/0017687 | A1 | 1/2004 | Misaras | |
| 2006/0198128 | A1* | 9/2006 | Piepgras | B29C 39/10 |
| | | | | 362/147 |
| 2007/0103902 | A1* | 5/2007 | Hsiao | E04F 13/0871 |
| | | | | 362/240 |
| 2007/0114559 | A1* | 5/2007 | Sayers | H01L 33/44 |
| | | | | 257/100 |
| 2007/0121326 | A1* | 5/2007 | Nall | F21V 29/004 |
| | | | | 362/294 |
| 2007/0159814 | A1* | 7/2007 | Jacobsson | E04F 15/02 |
| | | | | 362/153 |
| 2007/0188873 | A1* | 8/2007 | Wardas | F21V 14/003 |
| | | | | 359/609 |
| 2008/0253140 | A1* | 10/2008 | Fleischmann | B60Q 1/2696 |
| | | | | 362/487 |
| 2009/0059609 | A1 | 3/2009 | Marshall et al. | |
| 2009/0129107 | A1* | 5/2009 | Egerer | B60Q 3/004 |
| | | | | 362/509 |
| 2009/0302533 | A1* | 12/2009 | Smith | A63F 7/0668 |
| | | | | 273/108.1 |
| 2010/0265731 | A1* | 10/2010 | Van Herpen | B60Q 1/52 |
| | | | | 362/543 |
| 2011/0075395 | A1* | 3/2011 | Spurgeon | A63F 13/28 |
| | | | | 362/84 |
| 2011/0176091 | A1* | 7/2011 | Boonekamp | C09K 11/0883 |
| | | | | 349/86 |
| 2011/0194305 | A1* | 8/2011 | Chen | G02B 6/0041 |
| | | | | 362/606 |
| 2011/0222288 | A1* | 9/2011 | Vissenberg | F21V 11/18 |
| | | | | 362/253 |
| 2011/0228553 | A1* | 9/2011 | Igoe | B60Q 3/004 |
| | | | | 362/558 |
| 2011/0242800 | A1* | 10/2011 | Borghetto | E04F 13/0885 |
| | | | | 362/147 |
| 2011/0292641 | A1* | 12/2011 | Van Herpen | D06N 7/0036 |
| | | | | 362/153 |
| 2012/0169953 | A1* | 7/2012 | Kataoka | F21S 8/04 |
| | | | | 349/36 |
| 2012/0176776 | A1* | 7/2012 | Van Herpen | E04B 9/32 |
| | | | | 362/147 |
| 2013/0125499 | A1 | 5/2013 | Silderhuis | |
| 2013/0147347 | A1 | 6/2013 | Laporte | |

FOREIGN PATENT DOCUMENTS

| | | |
|---|---|---|
| DE | 10126670 A1 | 12/2002 |
| DE | 202007010458 U1 | 11/2007 |
| DE | 202007015925 U1 | 3/2008 |
| DE | 202006017924 U1 | 4/2008 |
| DE | 202008009589 U1 | 9/2009 |
| DE | 102009000605 A1 | 8/2010 |
| DE | 102009008845 A1 | 8/2010 |
| DE | 102010002282 A1 | 8/2011 |
| DE | 102010063735 A1 | 6/2012 |
| EP | 1848254 A1 | 3/2007 |
| EP | 1848254 A2 | 10/2007 |
| WO | 2008125261 A1 | 10/2008 |
| WO | 2009036552 A1 | 3/2009 |

OTHER PUBLICATIONS

Thomas Pichler, "Neuartige Lihtemitter sind billiger al OLEDs", Innovations-Report Aug. 2, 2010, printed on Aug. 23, 2013 from http://www.innovations-report.de/html/berichte/physik_astronomfe/ NeuartigeLichtemie/neuartige_lichtemmitter_billiger_oleds_148123. html (1 page) (dated Feb. 8, 2010); and translation from www. google.com/translate (1 page) (2 pages total).

Search Report of the European Patent Office in International Application No. 13176375.7-1755, dated Jan. 30, 2014, 5 pages.

Office Action, European Patent Office, Application No. 10 2012 216 665.3, dated Aug. 30, 2013; 7 pages.

Jens Wurtenburg; Licht-emittierende elektrochemische ZellenLeuchtende Folien von der Rolle, Aug. 22, 2012, printed from http://www.elektroniknet.de/optoeiektronik/sonstiges/ artikell90804/ on Aug. 23, 2013, 4 pages (translated pages from www.google.com/translate, 3 pages) (7 pages total).

\* cited by examiner

LIGHTING UNIT

CROSS-REFERENCE TO RELATED APPLICATION(S)

This application is a national stage application of and claims priority to German Patent Application No. 102012216665.3 filed on Sep. 18, 2012.

FIELD

The present disclosure relates to a lighting unit comprising a lamp which has one or more light-emitting diodes (LEDs) or other light emitting sources for lighting purposes. The present disclosure also relates to a piece of furniture comprising an integrated lighting unit, to a motor vehicle lining part comprising an integrated lighting unit, and also to a method for producing a lighting unit.

BACKGROUND

Various lighting units comprising LEDs are known from the prior art, for example from DE 20 2006 017 924 U1, DE 10 2010 063 735 A1, DE 20 2007 010 458 U1 and EP 1 848 254 A2.

SUMMARY

The object of the present invention is to create a lighting unit that is improved compared to the above-mentioned lighting units.

The object of the invention is achieved by means of the features of patent claim 1. Preferred embodiments of the invention are specified in the dependent patent claims.

In accordance with embodiments of the invention, the lighting unit has a board. Such a board is also referred to as a circuit board, printed circuit or printed circuit board (PCB). The board may have a component side comprising electronic components and a solder side comprising a masking lacquer. It may also be a multi-layered board, in particular what is known as a multilayer PCB. In particular, various circuit levels of the board can be electrically contacted with one another by what are known as vias. The board may also be formed such that the electronic components are embedded in the interior of the board. Suitable techniques for the integration of components into the interior of a board are known per se from the prior art, see Flexible Schaltungsträger mit eingebetteten, flexiblen ICs, Proceedings Elektronische Baugruppen and Leiterplatten-EBL 2012 (GMM-FB 71)-Hochentwickelte Baugruppen in Europa-6. DVS/GM-Tagung, Feb. 14, 2012-Feb. 15, 2012, Dr. Jan Kostelnik et. al.

According to embodiments of the invention, the lamp is arranged on the component side of the board. The decorative layer can cover the electronic components on the component side and also the conductive tracks located on the component side and the lamp, and can have a leveling effect such that the resultant decorative layer is smooth and continuous on its outer face.

The printed circuit board can also be formed such that the electronic components and the conductive tracks connected thereto are embedded in the interior of the board. In this case, the lamp may protrude from the surface of the board such that the decorative layer is interrupted by the lamp, or the lamp may likewise be embed-ded in the interior of the board, wherein the board in this case has a radiation opening, through which the radiation emitted by the lamp can radiate from the board and through the decorative layer.

In accordance with an embodiment of the invention, the decorative layer is applied by printing, in particular by means of inkjet printing or by means of screen printing. In particular a wood decoration, aluminum decoration (brushed or smooth) and a chrome decoration can be applied. The decorative layer in the form of a wood deco-ration can be applied for example in accordance with WO 2008/125261 A1, of which the disclosure is hereby incorporated in its entire scope into the disclosure and subject matter of the present patent application.

In accordance with an embodiment of the invention, the decorative layer includes light-emitting electrochemical cells (LECs), in particular based on organic materials, in particular what are known as graphene LECs. Such a decorative layer formed from LECs can be printed directly onto the surface of the board or can be applied in the form of a film. LECs are known per se from the prior art, see innovations-report 08.02.2010 URL: http://www.innovations-report.de/html/berichte/physik_astronomie/neuartige_lichtemitter_billiger_oleds_148123.html Neuartige Lichtemitter sind billiger als OLEDs and http://www.elektroniknet.de/opto/news/article/90804/0/Leuchtende_Folien_von_der_Roll e/22 Aug. 2012, Licht-emittierende elektrochemische Zellen.

In accordance with an embodiment of the invention, the lamps are formed as a layer of light-emitting electrochemical cells (LECs), and the layer of light-emitting electrochemical cells is arranged between the surface of the board and the decorative layer, wherein the layer of light-emitting electrochemical cells is applied for example by printing or as a film to the surface of the board, in particular directly to the surface of the board, and the layer of light-emitting electrochemical cells is activated by the electronic circuit.

The layer of light-emitting electrochemical cells can be applied to the entire surface of the board or to portions of the surface of the board. In the first case, the decorative layer also covers the entire surface of the layer of light-emitting electrochemical cells, whereas in the second case the decorative layer beyond the surface portions covered by the light-emitting electrochemical cells is applied directly to the surface of the board and in the region of the surface portions covers these, wherein a leveling effect can be produced, such that a flat outer face of the decorative layer is produced.

In accordance with an embodiment of the invention, the electronic circuit of the board has a sensor for generating a sensor signal. On the basis of the sensor sig-nal, the lamp is switched on or off by the electronic circuit or the brightness of the lamp is regulated in order to thus provide what is known as a dimmer.

The sensor may be an inductive, capacitive or optical proximity sensor for example, which is likewise covered by the decorative layer. The sensor can be embedded in the board.

In accordance with an embodiment of the invention, the electronic circuit is designed to activate an electrochromic layer, wherein the electrochromic layer covers the lamp. The electrochromic layer has a transparent state and a translucent state, in which the electrochromic layer is opaque. When the lamp is switched off, the electrochromic layer is in its opaque state, such that the lamp is hidden by the electrochromic layer, which is then non-transparent.

When the lamp is switched on, for example due to a corresponding sensor signal, the electrochromic layer is also activated by the electronic circuit so as to be brought into its transparent state, and therefore the lamp can irradiate through the electrochromic layer. The decorative layer on the surface of the board can be interrupted by the electrochromic layer. Alternatively, the decorative layer can cover the electrochromic layer, wherein the lamp then irradiates through the electrochromic layer and the decorative layer.

In accordance with an embodiment of the invention, the radiation permeability of the decorative layer is increased in the region of the beam path of the lamp in order to achieve improved energy efficiency. If the decorative layer is applied by means of printing, this can be achieved by reducing the saturation of the imprint in this region.

In a further aspect, the invention relates to a piece of furniture with an embodiment of a lighting unit according to the invention. The lighting unit may form an integral part of the piece of furniture, such as a screen, flap or a wall element of the piece of furniture.

In a further aspect, the invention relates to a motor vehicle lining part, such as a dash panel, in which an embodiment of a lighting unit according to the invention is integrated. For example, the lighting unit can be arranged on a support of the dash panel, wherein the decorative layer extends beyond the board and over the support of the dash panel.

In a further aspect, the invention relates to a method for producing a lighting unit according to the invention.

Embodiments of the invention in which the lighting unit can be produced cost-effectively with particularly few steps and few components, is particularly robust and can be integrated seamlessly into other components, such as furniture or other design objects, are particularly advantageous.

BRIEF DESCRIPTION OF THE DRAWINGS

Embodiments of the invention will be explained in greater detail hereinafter with reference to the drawings, in which.

Like or corresponding elements of the various embodiments will be denoted hereinafter by identical reference signs.

DETAILED DESCRIPTION OF ILLUSTRATIVE EMBODIMENTS

Figure 1:
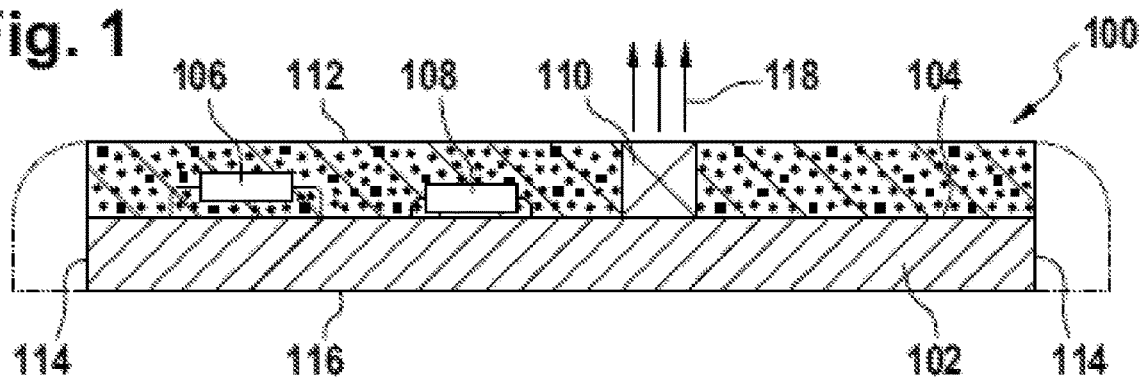
FIG. 1 shows a side view of a first embodiment of a lighting unit according to the invention.

FIG. 1 shows a lighting unit 100 for lighting a space. The lighting unit 100 is formed by a board 102. The board 102 has a surface 104, which may be the component side of the board 102. In this case, different electronic components and conductive tracks are arranged on the surface 104, an electric resistor 106 and a microprocessor 108 being shown by way of example in FIG. 1. Alternatively, the electronic components are embedded completely or in part in the interior of the board 102. Furthermore, the board may also be populated on both sides.

In the embodiment considered here, the board 102 is populated with an LED. The LED 110 is arranged on the component side of the board 102 and thus protrudes beyond the surface 104.

By applying a decorative layer 112, the surface 104 of the board 102 and also any electronic components located thereon, such as the resistor 106 and the microprocessor 108, are covered. In the embodiment considered here, the decorative layer 112 is interrupted by the LED 110, such that the LED 110 irradiates directly into the space, that is to say not through the decorative layer 112. The decorative layer 112 can extend beyond the lateral edges 114 of the board 102, as illustrated in FIG. 1 by dashed lines, and/or beyond the rear face 116 of the board.

The decorative layer 112 may be a wood decoration for example, which is applied by means of a printing method, for example by means of inkjet or screen printing, or for example in accordance with the method known from WO 2008/125261 A1.

The lighting unit can be integrated in a piece of furniture, such as in a piece of kitchen furniture, so as to carry out lighting functions there, for example in a worktop. Furthermore, the lighting unit 100 can be part of a dash panel of a motor vehicle, wherein the decorative layer 112 may extend in this case over a support of the dash panel.

Figure 2:
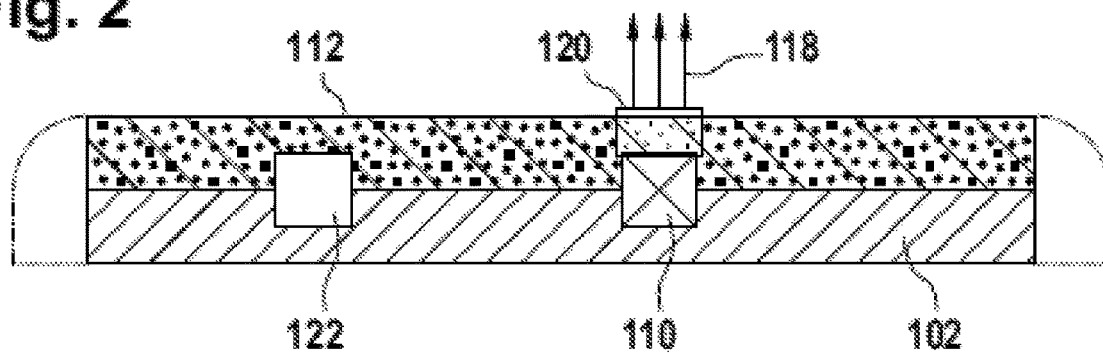
FIG. 2 shows a side view of a second embodiment of a lighting unit according to the invention with a sensor.

In accordance with the embodiment shown in FIG. 2, the LED 110 is partly recessed into the board 102, such that it is covered by the decorative layer 112. In this case, the light 118 of the LED 110 is irradiated through the decorative layer 112.

The decorative layer 112 can be designed here such that it has increased radiation permeability in the bridging region 120, in which it bridges the LED 110, as illustrated in FIG. 2. If the decorative layer 112 is applied by means of a printing method, this can be achieved by carrying out the printing process with lower saturation in the bridging region 120.

A continuous and smooth decorative layer 112 can thus be generated, which hides the LED 110, which is then only obvious to the user when the LED 110 is switched on for lighting purposes.

In the embodiment considered here, the electronic circuit of the board 102 includes a sensor 122, which is designed to output a sensor signal, which is evaluated by the electronic circuit in order to switch the LED 110 on or off or in order to regulate the brightness of the LED 110. For example, the sensor 122 may be a proximity sensor. If a user then approaches the lighting unit 110, this is then sensed by the sensor 122, and the LED 110 is switched on by the electronic circuit on the basis of the corresponding sensor signal. Similarly, the LED 110 can be switched off again by the electronic circuit when the user moves away.

In the embodiment considered here, the sensor 122 is recessed partly in the board 102 and is covered by the decorative layer 112.

Figure 3:
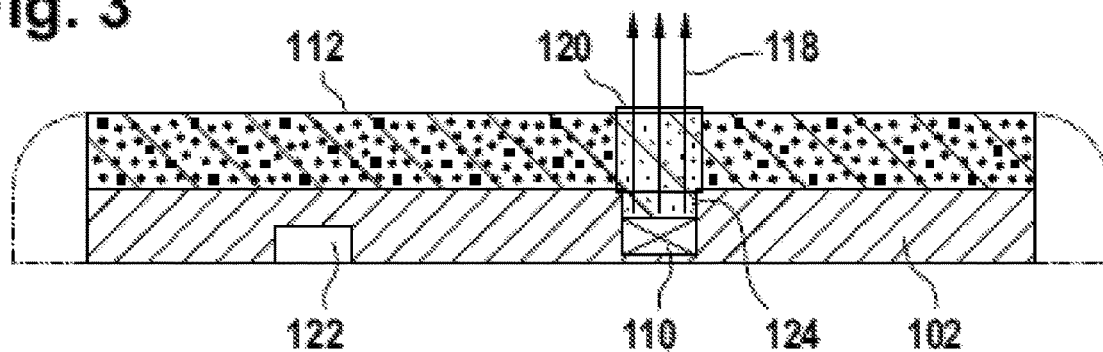
FIG. 3 shows a sectional view of a further embodiment of a lighting unit according to the invention, in which the lamp is embedded in the board.

The sensor 122 and the LED 110 can also be embedded in the board 102 however, as is shown in FIG. 3. In this case, the board 102 has an opening 124, for example in the form of a blind bore, through which the light 118 can be irradiated. In this case too, the radiation permeability of the decorative layer 112 can be increased in the bridging region 120.

Figure 4A:
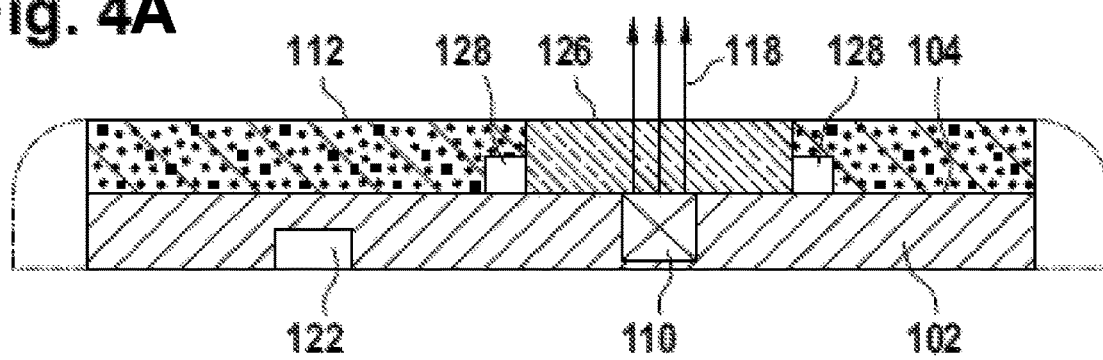
FIG. 4A shows a sectional view of a further embodiment of a lighting unit according to the invention with an electrochromic layer.

In the embodiment according to FIG. 4A, an electrochromic layer 126 is arranged on the surface 104 of the board 102 and covers the light-emitting diode 110 embedded in the board 102. The electrochromic layer 126 is contacted by contact elements 128 of the electronic circuit so as to be able to apply a voltage across the electrochromic layer 126. The decorative layer 112 is interrupted in the embodiment considered here by the electrochromic layer 126. Alternatively however, the decorative layer may also cover the electrochromic layer 126, similarly to the embodiments according to FIGS. 2 and 3.

The electrochromic layer 126 has a transparent state and an opaque state. In the opaque state, the electrochromic layer can be permeable to light, but non-transparent and may have an optical appearance similar to what is known as "milk glass".

Figure 4B:
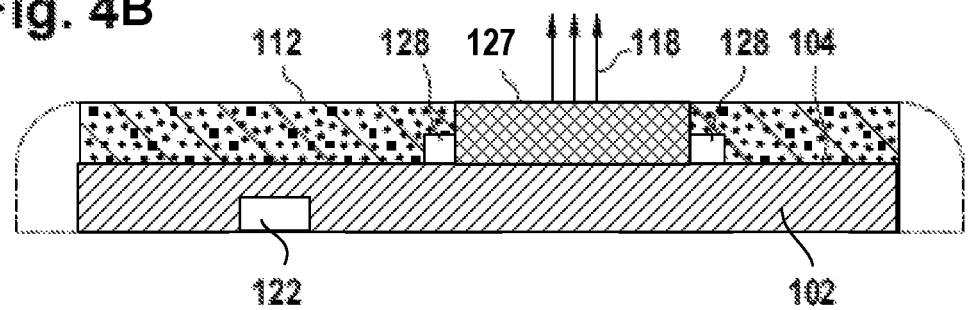
FIG. 4B shows a sectional view of a further embodiment of a lighting unit according to the invention with a light-emitting electrochemical cell.

In the embodiment according to FIG. 4B, a light-emitting electrochemical cell (LEC) layer 127 is arranged on the surface 104 of the board 102. The LEC 127 is contacted by contact elements 128 of the electronic circuit so as to be able to apply a voltage across the LEC 127. The decorative layer 112 is interrupted in the embodiment considered here by the LEC 127. Alternatively however, the decorative layer may also cover the LEC 127, similarly to the embodiments according to FIGS. 2 and 3.

In accordance with an embodiment of the invention, the lamps can be formed as a layer of light-emitting electrochemical cells (LECs) 127, and the layer of light-emitting electrochemical cells 127 is arranged between the surface 104 of the board 102 and the decorative layer 112, wherein the layer of light-emitting electrochemical cells 127 is applied for example by printing or as a film to the surface 104 of the board 102, in particular directly to the surface 104 of the board 102, and the layer of light-emitting electrochemical cells 127 is activated by the electronic circuit via the contact elements 128.

The layer of light-emitting electrochemical cells 127 can be applied to the entire surface 104 of the board 102 or to portions of the surface 104 of the board 102. In the first case, the decorative layer 112 also covers the entire surface of the layer of light-emitting electrochemical cells 127, whereas in the second case the decorative layer 112 beyond the surface portions covered by the light-emitting electrochemical cells 127 can be applied directly to the surface 104 of the board 102 and in the region of the surface portions covers these, wherein a leveling effect can be produced, such that a flat outer face of the decorative layer 112 is produced.

Figure 5:
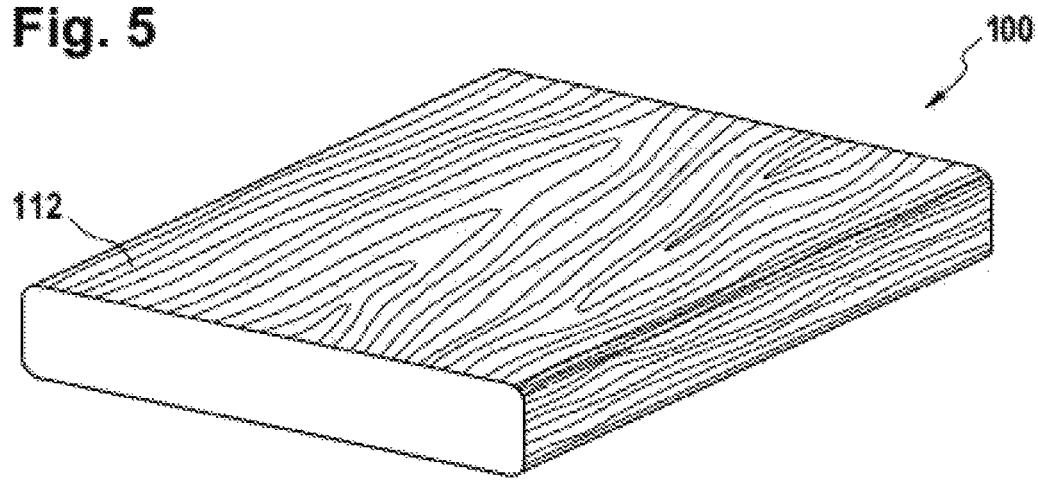
FIG. 5 shows a perspective view of a lighting unit according to the invention in the switched-off state.

FIG. 5 shows an embodiment of the lighting unit 100 when the light-emitting di odes diodes 110 are switched off. In this state, a user cannot perceive the light-emitting diodes 110 or other electronic elements of the lighting unit 100. In the embodiment considered here, the decorative layer 112 presents a wood decoration, such that the lighting unit 100 appears to be an element made of wood.

Figure 6:
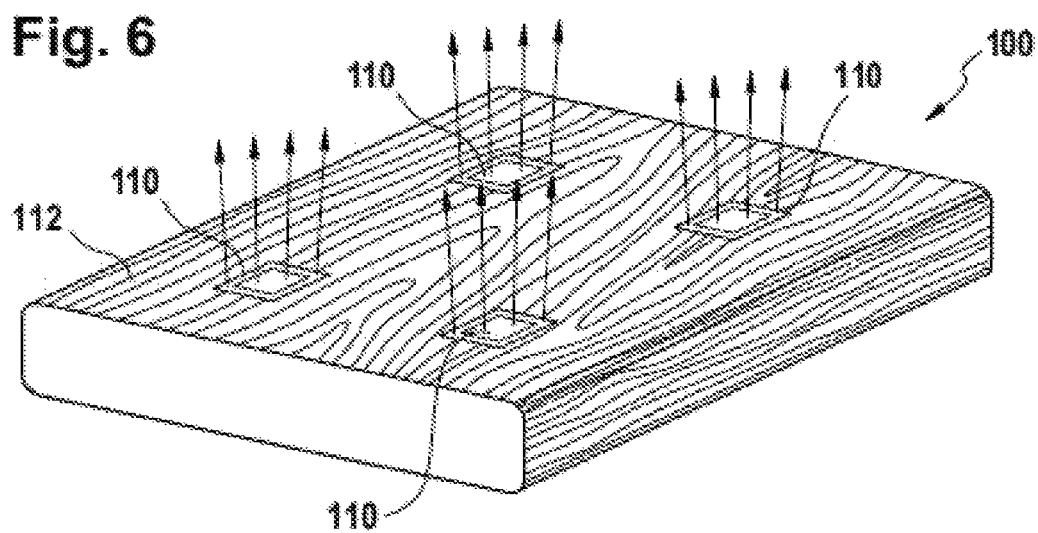
FIG. 6 shows a perspective view of the lighting unit according to FIG. 5 in the switched-on state.

If a user then approaches the lighting unit 100, the LEDs 110 are thus switched on and irradiate light, as illustrated in FIG. 6.

Though the present invention has been described with reference to preferred embodiments, workers skilled in the art will recognize that changes may be made in form and detail without departing from the scope of the invention.

LIST OF REFERENCE SIGNS

100 lighting unit
102 board
104 surface
106 resistor
108 processor
110 light-emitting diode
112 decorative layer
114 edge
116 rear face
118 light
120 bridging region
122 sensor
124 opening
126 electrochromic layer
128 contact element

What is claimed is:

1. A method for producing a lighting unit, the method comprising:
providing a printed circuit board supporting a lamp and an electronic circuit configured to activate the lamp; and
applying by at least one of inkjet printing and screen printing a decorative layer directly on a surface of the printed circuit board, wherein the electronic circuit is provided with contact elements arranged on the surface of the printed circuit board and configured to contact an electrochromic layer, wherein the electrochromic layer is applied extending over the lamp, wherein the electrochromic layer can be brought into a first transparent state or a second translucent state by activation by the electronic circuit, wherein light emitted from the lamp only passes through the first transparent state of the electrochromic layer, and wherein the electrochromic layer is configured to hide the lamp until the lamp is activated;
wherein applying the decorative layer further comprises applying the decorative layer over the electrochromic layer extending over the lamp and reducing saturation of the portion of the decorative layer in the region extending over the lamp.

2. The method of claim 1, wherein the decorative layer applied comprises one or more inks.

3. The method of claim 1, wherein the lamp forms a layer on aportion of the surface of the printed circuit board and wherein the decorative layer is applied to the layer formed by the lamp.

4. The method of claim 1, wherein the lamp includes one or more light-emitting diodes (LEDs).

5. The method of claim 1, wherein the lamp includes one or more light-emitting electrochemical cells (LECs).

6. The method of claim 5, wherein applying the decorative layer comprises printing the decorative layer including the one or more light-emitting electrochemical cells (LECs) on to the surface, thereby providing the lamp.

7. The method of claim 1, wherein the lamp protrudes from the surface of the printed circuit board, wherein the applied decorative layer covers the lamp and has a leveling effect, such that a surface of the decorative layer is smooth and continuous.

8. The method of claim 1, wherein the lamp is recessed in the printed circuit board, the printed circuit board has a radiation opening for the outlet of radiation of the lamp, and the decorative layer covers the radiation opening.

9. The method of claim 1, wherein the electronic circuit is provided with a sensor for outputting a sensor signal, wherein the electronic circuit is designed to switch on or switch off or to regulate the luminosity of the lamp in response to the sensor signal.

10. The method of claim 1, wherein the electronic circuit is provided with a sensor, and wherein the sensor is a proximity sensor including at least one of an inductive proximity sensor, a capacitive proximity sensor, and an optical proximity sensor.

11. The method of claim 1, wherein the electronic circuit is provided with a sensor configured to generate a sensor signal in response to detecting a proximity of a user, wherein the state of the electrochromic layer is brought into the transparent state by means of the sensor signal when the lamp is switched on.

12. The method of claim 1, wherein the surface of the printed circuit board is on at least one of a component side and a solder side of said printed circuit board.

13. The method of claim 1, wherein the lighting unit is provided with a plurality of electronic components, wherein at least one of the plurality of electronic components is embedded in the printed circuit board.

14. The method of claim 1, wherein the lighting unit is integrated into at least one of a screen, a flap, a panel, and a worktop of a piece of furniture.

15. The method of claim 1, wherein the lighting unit is integrated into a panel of a motor vehicle.

16. The method of claim 1, wherein the electronic circuit is provided with a sensor, and wherein the sensor is embedded in the printed circuit board and is covered by the applied decorative layer.

17. The method of claim 1, wherein reducing saturation of the portion of the decorative layer in the region extending over the lamp increases radiation permeability in the region extending over the lamp.

18. The method of claim 1, wherein reducing saturation of the portion of the decorative layer in the bridging region extending over the lamp increases radiation permeability in the bridging region extending over the lamp.

19. The method of claim 18, wherein light emitted from the lamp passes only through the bridging region.

* * * * *